United States Patent
Gudmundsson

[11] Patent Number: 5,903,433
[45] Date of Patent: May 11, 1999

[54] COOLING SYSTEM FOR TELECOMMUNICATIONS EQUIPMENT ARRANGED IN A CABINET OR SIMILAR

[75] Inventor: Björn Gudmundsson, Sollentuna, Sweden

[73] Assignee: Telefonaktiebolaget LM Ericsson, Stockholm, Sweden

[21] Appl. No.: 08/836,808

[22] PCT Filed: Dec. 11, 1995

[86] PCT No.: PCT/SE95/01489

§ 371 Date: May 21, 1997

§ 102(e) Date: May 21, 1997

[87] PCT Pub. No.: WO96/19046

PCT Pub. Date: Jun. 20, 1996

[30] Foreign Application Priority Data

Dec. 14, 1994 [SE] Sweden .................................. 9404359

[51] Int. Cl.⁶ ........................................................ H05K 7/20
[52] U.S. Cl. .......................... 361/697; 165/80.3; 361/724; 454/184
[58] Field of Search .......................... 454/184; 174/35 R, 174/15.1, 16.1, 16.3; 165/80.3, 185, 122–126; 361/690–697, 701, 724, 814, 816, 818

[56] References Cited

U.S. PATENT DOCUMENTS 2,300,303 10/1942 Morrison .
4,758,924 7/1988 Dillon ...................................... 361/383
5,506,373 4/1996 Hoffman ............................. 174/35 GC
5,603,376 2/1997 Hendrix ................................. 361/724

FOREIGN PATENT DOCUMENTS 2-143715   9/1989  Japan .
1-245188   6/1990  Japan .
1431082   10/1988  Sweden ................................. 361/383
1 526 321  9/1978  United Kingdom .

Primary Examiner—Gerald Tolin
Attorney, Agent, or Firm—Burns, Doane, Swecker & Mathis, L.L.P.

[57] ABSTRACT

A cooling system for telecommunications equipment. Components which emit most heat, such as power units, radio transmitters, final stages and the like, are mounted in a first cabinet space, while remaining components that emit less heat are mounted in a second hermetically closed space. The first space is cooled with circulation air which enters the system from ambient and flows through channels or like conduits past the components in the first space. The second space is cooled with air that circulates through a heat exchanger mounted in the first space. The components that emit the most heat are housed in hermetically closed boxes that are preferably EMC-shielded against the surroundings and that have heat sinks mounted on the outside thereof. Air may be circulated through the first space, the second space, and through the heat exchanger with the aid of a fan. The air circulated through the first space flows in counter direction relative to the air circulated through the heat exchanger.

12 Claims, 1 Drawing Sheet

COOLING SYSTEM FOR TELECOMMUNICATIONS EQUIPMENT ARRANGED IN A CABINET OR SIMILAR

TECHNICAL FIELD

The present invention relates to a cooling system for cooling telecommunications equipment housed in a cupboard, cabinet or like housing.

DESCRIPTION OF THE BACKGROUND ART

Radio base stations used in mobile telephone communications systems emit large quantities of heat, which must be removed. Typical cabinet heat emissions may be as large as 1600–2500 W. Up to 80% of this heat emission takes place in the radio transmitter equipment. The cooling function is instrumental in controlling the mechanical design of the cabinet more than the radio or electronic equipment. Contaminated and wet outdoor air cannot be used directly to cool the electronics. The outdoor air, or ambient air, however, is the ultimate receiver of the heat emitted from the cabinet.

Hitherto, radio base stations have mostly been installed indoors. The mechanics and the electronics and radio equipment cooling system have been designed to fulfil the requirements occasioned by indoor climates, both with regard to temperature and the concentration of air-carried contaminants. However, there is a trend in the overall manufacture of mobile telephone systems to construct small outdoor installations which are mounted on posts or on the outer walls of building structures and used in the cellular network. In principle, these outdoor installations have hitherto been indoor systems mounted outdoors in containers that include large cooling machines. It is probable that outdoor installations will become more and more usual in the future, particularly in the case of smaller installation types referred to as compact, micro or pico radio base stations. This will place new requirements on the cooling system and on the mechanics.

Essentially three different types of outdoor installations are used at present, viz direct cooling with outdoor air, hermetically sealed spaces equipped with heat-exchangers, and hermetically sealed cabinets equipped with air-conditioning, cooling machines.

The first type of installation includes an outdoor cabinet which houses electronic equipment constructed in the indoor mode, and is cooled directly with outdoor air that has been filtered very effectively. Although this filtering process removes solid contaminants, it does not remove wet and acid gases, which have a damaging effect on the electronics.

In the second type of installation, the heat emitted is released to the ambient outdoor air via heat-exchangers. In this case, the heat emitted, which can reach several kW, must pass through several stages before being dispersed to the ambient air: From component to heat sink, to air within the housing or cabinet, through heat-exchangers, and finally out to the ambient air. Each stage or step results in a certain increase in component temperature. The heat-exchanger can result in a 15° C. increase of indoor temperature contra outdoor temperature. In climates of 45–50° C., this design will be unable to fulfil the requirement of maintaining electronic and radio components at a temperature of 70–80° C. The heat-exchanger must also be designed for all heat that passes therethrough. In the case of capacities of one to two kW (1–2 kW), this means that the heat-exchanger must have a size comparable with or almost equal to the size of the electronic and radio equipment.

The cooling equipment which includes cooling machines, and possibly also heat-exchangers, used in the third type of installation, may have a size which is as much as half the size of the radio and electronic equipment. Redundancy cannot be easily achieved. The system is highly complex and requires an advanced control system. The present cost of a system that lacks redundancy may reach to one-third to one-half of the cost of the entire radio base station. Operating costs are just as high. More than one-third of the heat emission power, in addition to that generated in the electronic equipment, is needed for the cooling machine to remove heat from the housing. This additional heat is liable to influence the surroundings in some sites or scenario. However, this type of cooling system is the only available type that will fulfil the requirements that are placed on the temperature of the electronics with regard to both indoor and outdoor climates.

The aforesaid systems have the drawback of being space-consuming and complicated, of requiring additional fans to circulate air through the system, and of incurring high operating costs.

SUMMARY OF THE INVENTION

The object of the present invention is to avoid the drawbacks of existing systems and to provide a cooling system which is a) functionally simple and which can therefore be readily installed, b) is highly reliable in operation, c) does not require the provision of additional fans, and d) can be operated at low costs. This object is achieved with a cooling system that has the characteristic features set forth in the following claims.

The inventive cooling system includes a first space in which outdoor air passageways or channels are provided. The system is based on the fact that radio transmission boards and components are EMC-shielded in hermetically closed boxes with externally mounted heat sinks. The majority of the heat is emitted here. The outdoor air passageways result in parallel air flows through the radio base station in direct contact with the heat sinks. One of the flows passes through a small heat-exchanger, through which air which cools the remainder of the electronic equipment passes, said remaining electronic equipment being housed in a second hermetically sealed space and emitting far less heat than the earlier-mentioned components. A small fan can be used to drive the air flow through the heat-exchanger. The heat-exchanger need not have good efficiency, and can therefore be very compact and have the form of a transverse-flow heat-exchanger. Since the electronic equipment in the second space emits less heat, which is uniformly distributed, and has relatively good heat transmission with respect to associated circuit boards, the temperature difference between cooling air and circuit boards may be far smaller than in the case of radio transmitters and the like housed in the boxes.

The invention affords the following advantages: The size of the radio base station can be reduced by one-third or more in comparison with known systems; installation is much easier to accomplish; the system is far less complex (the second type of system mentioned above requires the provision of additional fans or blowers to force the air through the heat-exchanger, which will offer considerable resistance to the air flow because of the high effectiveness required); and operating costs are far lower than the costs entailed by known systems.

The invention will now be described in more detail with reference to a preferred exemplifying embodiment thereof and also with reference to the accompanying drawing.

DETAILED DESCRIPTION OF A PREFERRED EMBODIMENT

Figure 1:
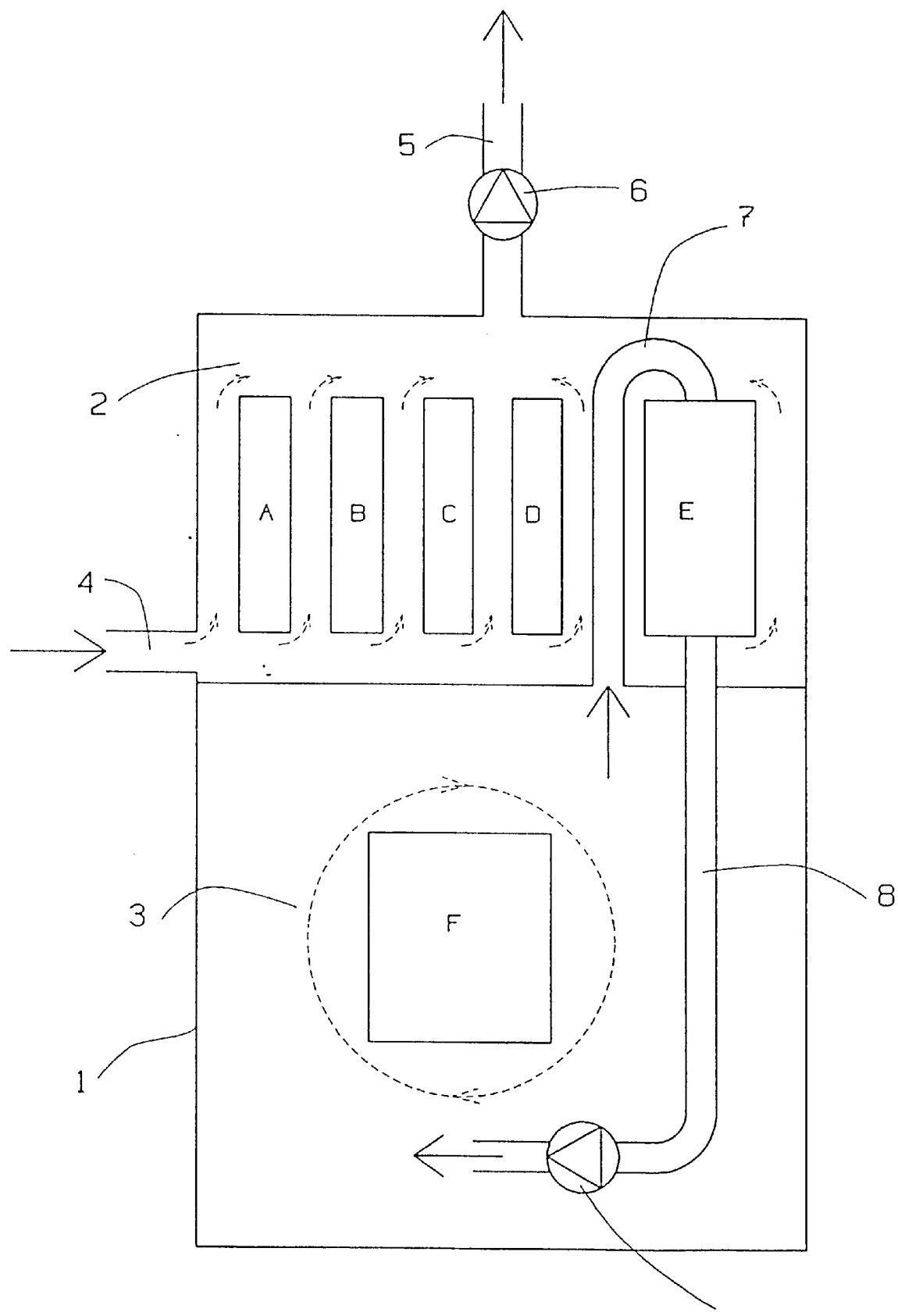
FIG. 1 is a schematic illustration of one embodiment of the invention.

FIG. 1 illustrates schematically telecommunications equipment, for instance a radio base station, which includes electronic components, such as radio transmitters and radio receivers, terminal stages, AC/DC converters, power units (stages), etc. The equipment is housed in a cupboard or cabinet 1 which is divided into a first space 2 and a second, hermetically closed space 3. Those components which emit most heat, such as power units, radio transmitters, final stages or the like, which are enclosed in EMC-shielded, hermetically closed boxes provided with heat sinks, have been referenced A, B, C and D in FIG. 1 and are mounted in the space 2. For the purpose of conducting heat away from these components, the space 2 is provided with a cooling-air inlet 4 and an outlet 5. The heat is carried away to the ambient air. The cooling air is circulated through the space 2 with the aid of a fan 6 provided in the outlet 5. Naturally, the fan 6 may alternatively be mounted in the inlet 4, if this is considered to be more beneficial.

Although not shown in the drawing, channels or like conduit means are provided in the space 2 for guiding the air flow past the component boxes A–D parallel therewith, as shown by the dotted arrows in the drawing, and more specifically past the box-mounted heat sinks. The channels may be comprised of plastic or rubber tubing or the like, or may alternatively be constructed from plastic or sheet-metal plates. An air flow is guided past a heat-exchanger E, which is also mounted in the space 2 as explained below.

All other equipment in the radio base station, i.e. the equipment that does not emit so much heat, is mounted in the second, closed space 3 in the cabinet. This equipment has been generally referenced F in the drawing. However, the heat emitted by this equipment must also be led away. Accordingly, the heat is removed by heat-exchange with cooling air in the heat-exchanger E in the space 2. To this end, channels 7 and 8 are disposed between the space 3 and the heat-exchanger E, and a fan 9 is fitted in one of these channels, channel 8 in the illustrated case, for circulating the air in said space 3 and through the heat-exchanger, as shown by the arrows. Since the components F do not emit as much heat as the remaining components, said heat also being distributed relatively uniformly, and since associated circuit boards exhibit relatively high heat transfer between board and cooling air, the heat-exchanger E need not have good efficiency and may therefore be compact. The air flow is conveniently passed through the heat-exchanger in counterflow relatively to the air flow past the heat-exchanger in the space 2.

It will be understood that the component boxes A–D shown in the Figure may in reality be more or fewer than four, and that the generally shown component F in the second space 3 actually comprises a plurality of mutually different components. Naturally, the space 2 may also be divided into several separate sections that have the same function as that described above and in which one or more of the component boxes A-D and the heat-exchanger E are selectively arranged. It will also be understood that the invention is not restricted to the aforedescribed and illustrated exemplifying embodiment thereof and that modifications can be made within the scope of the following claims.

I claim:

1. A cooling system for telecommunications equipment comprising:

a cabinet having a first space and a hermetically sealed second space;

a first telecommunications component that generates a first amount of heat;

a second telecommunications component that generates a second amount of heat less than the first amount of heat;

at least one hermetically sealed box having heat sinks, located in said first space, and holding said first telecommunications component, said hermetically sealed second space holding air and said second telecommunications component;

means for circulating ambient air through said first space to cool said hermetically sealed box;

a heat-exchanger located in the first space for cooling the air in said hermetically sealed second space to cool said second telecommunications component; and a channel communicating the air in said hermetically sealed second space with said heat-exchanger.

2. A cooling system according to claim 1, wherein said channel is at least partially located in said hermetically sealed second space and said first space.

3. A cooling system according to claim 1, further comprising a first fan for circulating the ambient air through the first space.

4. A cooling system according to claim 3, further comprising a second fan for circulating the air within said hermetically sealed second space through the heat-exchanger.

5. A cooling system according to claim 4, wherein the ambient air circulated by the first fan counterflows relative to the air circulated through the heat-exchanger by the second fan.

6. A cooling system according to claim 1, wherein the hermetically closed boxes are EMC-shielded.

7. A cooling system for telecommunications equipment, comprising:

a first space;

a first telecommunications device located in said first space that generates a first heat amount when operating;

a hermetically sealed second space;

a second telecommunications device located in said hermetically sealed second space that generates a second heat amount when operating that is less than the first heat amount;

a gas located in said hermetically sealed second space;

an inlet into said first space communicating said first space with ambient air;

an outlet out of said first space communicating said first space with ambient air, said inlet and outlet for circulating ambient air through said first space to cool said first telecommunications device;

a heat exchanger in communication with ambient air that circulates through said first space; and a gas circulation conduit for circulating the gas in said hermetically sealed second space through said heat exchanger to cool said second telecommunications device.

8. A cooling system according to claim 7, further comprising a fan for circulating the ambient air through said first space.

9. A cooling system according to claim 7, further comprising a fan for circulating the gas through said gas circulation conduit, said heat exchanger, and said hermetically sealed second space.

10. A cooling system according to claim 7, wherein said heat exchanger is located within said first space.

11. A cooling system according to claim 7, wherein said heat exchanger is a counterflow heat exchanger.

12. A cooling system for telecommunication equipment, comprising:
- a cabinet having a first space and a hermetically sealed second space;
- at least one hermetically sealed box located in said first space;
- a telecommunications device of a first heat generating capacity located in said first space;
- a telecommunications device of a second heat generating capacity less than said first heat generating capacity located in said hermetically sealed second space;
- means for circulating ambient air through said first space to cool said telecommunications device located in said first space; and
- means for cooling a gas in said hermetically sealed space with ambient air circulating through said first space.

* * * * *